(12) United States Patent
Kim et al.

(10) Patent No.: US 6,367,415 B2
(45) Date of Patent: Apr. 9, 2002

(54) VIEW PORT OF A CHEMICAL VAPOR DEPOSITION DEVICE FOR MANUFACTURING SEMICONDUCTOR DEVICES

(75) Inventors: Tae-Hoon Kim; Byung-Chul Kim; Kwon Son; Bong-Soon Lim, all of Suwon (KR)

(73) Assignee: Samsung Electronics Co., Ltd., Suwon (KW)

( * ) Notice: Subject to any disclaimer, the term of this patent is extended or adjusted under 35 U.S.C. 154(b) by 0 days.

(21) Appl. No.: 09/800,894

(22) Filed: Mar. 8, 2001

(30) Foreign Application Priority Data

Aug. 7, 2000 (KR) .............................................. 00-45598

(51) Int. Cl.$^7$ ........................ C23C 14/52; H01L 21/205; H01L 21/3065
(52) U.S. Cl. .................. 118/723 E; 220/200; 220/237; 220/336; 220/377
(58) Field of Search ...................... 118/723 E; 220/200, 220/215, 334, 377

(56) References Cited

U.S. PATENT DOCUMENTS

| | | | | |
|---|---|---|---|---|
| 4,809,862 A | * | 3/1989 | Canty | .......................... 220/663 |
| 4,830,216 A | * | 5/1989 | Miyauchi | ..................... 220/377 |
| 5,129,994 A | * | 7/1992 | Ebbing et al. | ................. 216/55 |
| 5,141,125 A | * | 8/1992 | Canty et al. | ................. 220/336 |
| 5,230,437 A | * | 7/1993 | Kelly | ......................... 220/237 |

FOREIGN PATENT DOCUMENTS

| | | | |
|---|---|---|---|
| JP | 4-103770 | * | 4/1992 |
| JP | 8-243379 | * | 10/1996 |
| JP | 10-168568 | * | 6/1998 |

* cited by examiner

Primary Examiner—Gregory Mills
Assistant Examiner—Sylvia R. MacArthur
(74) Attorney, Agent, or Firm—Volentine Francos, PLLC

(57) ABSTRACT

A view port of chemical vapor deposition apparatus for manufacturing semiconductor devices prevents heat loss in a chamber during a plasma deposition process. The view port includes a bracket protruding at the circumference of an opening in an electrode serving as a wall of a chamber of the apparatus, a transparent window pressed by the bracket against the wall via an O-ring, a pivoting cap for capping an opening in the bracket aligned with the window, and heat-insulative material and/or a heating element integral with the cap so as to be positioned close to the window when the cap is closed. The heating element can be a resistive heating wire or a warm air duct formed by a hose or the like. During the deposition process, the temperature of the window is maintained, thereby minimizing the tendency of polymer to adhere to the window.

12 Claims, 4 Drawing Sheets

_US 6,367,415 B2_

VIEW PORT OF A CHEMICAL VAPOR DEPOSITION DEVICE FOR MANUFACTURING SEMICONDUCTOR DEVICES

BACKGROUND OF THE INVENTION

1. Field of the Invention

The present invention relates to a chemical vapor deposition device for manufacturing semiconductor devices. More particularly, the present invention relates to a view port of the chemical vapor deposition device that allows the chemical vapor deposition process to be observed from outside the process chamber.

2. Description of the Related Art

Chemical Vapor Deposition (CVD) is a process in which a wafer surface is coated with a compound. CVD systems are classified as atmospheric pressure CVD systems, low pressure CVD systems, and high pressure CVD systems depending on the pressure used during the process performed thereby.

In addition, Plasma Enhanced CVD (PECVD) is a low pressure deposition process in which gaseous neutral molecules are bombarded with highly-accelerated electrons, produced by glow discharge, whereby the molecules decompose and assume the state of plasma. The molecules of the plasma are deposited on a surface of a substrate under a chemical reaction with the material thereof.

As shown in FIG. 1, a PECVD apparatus requires a pair of electrodes 1, 2 to form the plasma. The electrodes 1, 2 are supplied with high frequency power, to thereby create plasma out of the gaseous molecules filling a process chamber 3. The molecules of the plasma are then deposited on a surface of the wafer 4 supported within the process chamber 3.

The electrodes 1, 2 serve to form the walls of the process chamber 3 and to emit high frequency power. The electrode 2 also defines openings therein at which a plurality of view ports 5 are provided. These view ports 5 are disposed at the same height as or higher than the wafer 4 supported in the chamber. The view ports 5 are made of transparent material. In particular, the view ports include a pane of transparent material 5a (hereinafter referred to merely as a "window") that allows a user to see inside the chamber 3 and thereby obtain information regarding the progress of the PECVD process.

The PECVD apparatus also includes a vacuum port 6. In PECVD, the chamber 3 must always contain a constant amount of gas. Any gas in the chamber 3 in excess of that constant amount is discharged from the chamber through the vacuum port 6. The vacuum port 6 also allows impurities created as the result the process to be discharged from the chamber together with the excess process gas.

The impurities discharged through the vacuum port 6 include some polymer created when the plasma is formed. Most of the polymer, however, is deposited on the inner surfaces of the electrodes 1, 2. Such polymer is removed regularly from the electrodes 1, 2 in a cleaning process. The polymer is also deposited on the inner surfaces of the view ports 5. The surface temperatures of the windows 5a and the electrodes 1, 2 differ due to their being made of different materials. Accordingly, more polymer is deposited on the inner surfaces of the windows 5a than on the inner surfaces of the electrodes 1, 2. The polymer eventually falls from the inner surfaces of the windows 5a onto the wafer 4, causing the manufacturing process to fail.

In addition, the polymer deposited on the inner surface of the transparent window 5a makes it is impossible to see inside the chamber 3.

In order to prevent the polymer from adhering to the inner surface of the window of the view port or to remove the polymer once it adheres to the surface, Japanese Patent Publication No. Hesei 3-050723 proposes heating the window using an alloy ire or using a structure that directs dry warm air onto the surface. Japanese Patent Publication No. Hesei 8-246148 discloses a transparent window made of acryl resin, polyester resin, epoxy resin, polycarbonate resin, or polyamide resin, that resists the tendency of polymer to adhere thereto. In addition, Japanese Patent Publication No. Hesei 11-204294 discloses a heater provided on a window of a view port to prevent impurities from accumulating on the window. However, integrating the window with an alloy wire or an air guiding structure is very difficult. In addition, the alloy wire and the heated air dirty the window rather quickly, making it very difficult to see inside of the chamber 3.

Japanese Patent Publication No. Hesei 9-196059 discloses a transparent window coated with Teflon, a polymer of the fluorine series, or a heat-resistant rubber. Providing the window with an anti-corrosion material may protect the window, but does not serve to prevent the polymer from adhering to the window or to remove the polymer once it becomes adhered to the window. On the other hand, the requirements of a film capable of preventing the polymer from adhering to the window are rather severe, i.e., the film must be of a transparent material as well as be resistant to high temperatures.

SUMMARY OF THE INVENTION

An object of the present invention is to overcome the above-described technical problems associated with the prior art. More specifically, the object of the present invention is to provide an economical and effective view port by which the inside of the chamber can be readily observed and yet by which heat loss through the window thereof is prevented, thereby suppressing the tendency of polymer to adhere to the window surface.

To achieve this object, the view port of the chemical vapor deposition device of the present invention includes a bracket protruding from the outside of the chamber and extending around an opening formed in an electrode serving as a wall of the chamber, the bracket having an opening therethrough, a window held by the bracket against the wall via an O-ring, a cap for capping the opening of the bracket; one side of the cap being connected to one side of the bracket with a hinge, the other side of the cap detachably connected to the bracket by a locking member, whereby the cap is movable between open and closed positions, and heat loss-preventing means integral with the cap for preventing heat loss at the window.

The heat-loss preventing means can be a body of heat-insulating material attached to or making up a substantial part of the cap. The heat-loss preventing means can also comprise a heater element, such as a resistive heating element or a warm air duct, discrete from the window but disposed close to the front surface thereof, and integral with the cap. When the cap is opened, the heat loss-preventing means is moved away from the front surface of the window so that the inside of the chamber can be observed. However, when the cap is closed during the deposition process, the heat loss-preventing means is held close to the front surface of the window and serves to maintain the high temperature state of the window. With the window maintained at a high temperature, impurities created during the deposition process can not adhere thereto.

BRIEF DESCRIPTION OF THE DRAWINGS

These and other objects, features and advantages of the present invention will become better understood from the following detailed description thereof made with reference to the accompanying drawings, of which.

DETAILED DESCRIPTION OF THE PREFERRED EMBODIMENTS

Figure 1:
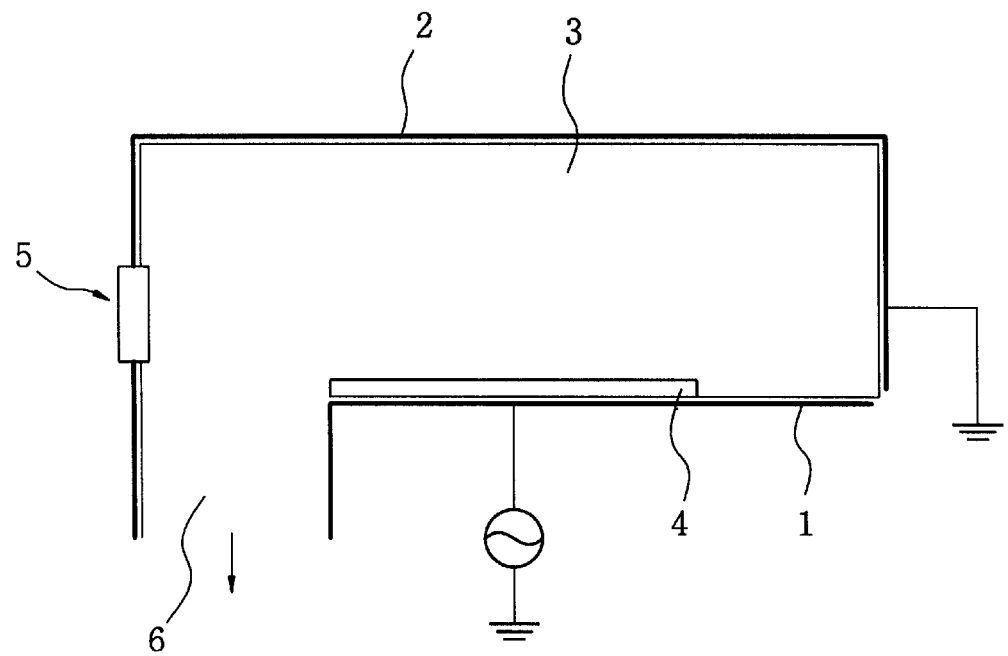
FIG. 1 is a sectional view of a prior art chemical vapor deposition apparatus for manufacturing a semiconductor device.
Figure 2:
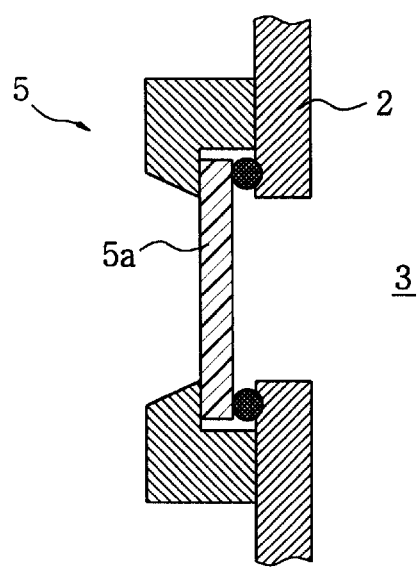
FIG. 2 is an enlarged sectional view of a view port of the prior art chemical vapor deposition apparatus.
Figure 3:
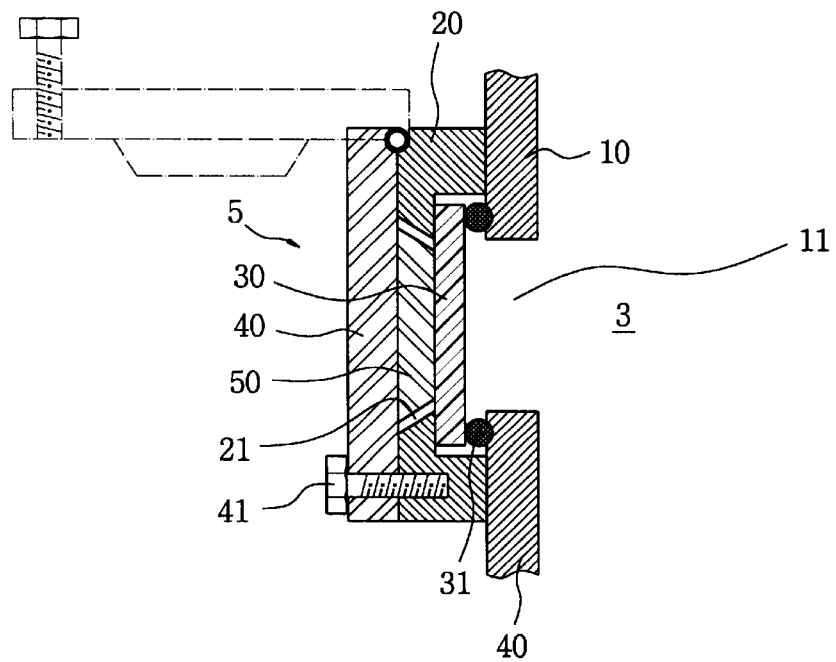
FIG. 3 is an enlarged sectional view of a view port of an embodiment of a chemical vapor deposition apparatus according to the present invention.

FIG. 3 shows a view port of a chemical vapor deposition device for manufacturing a semiconductor device according to the present invention. In this figure, reference numeral 10 designates a second electrode that also serves as a wall of the process chamber 3.

Wafers can be safely placed on the first electrode in the process chamber 3. The second electrode 10 defines an opening or through-hole 11 at a location higher than that of the wafers supported on the first electrode. The through-hole 11 has a predetermined size that allows the inside of the chamber 3 to be observed from the outside. A transparent window pane 30 (hereinafter referred to merely as a "window") covers the through-hole 11. An O-ring 31 provides a seal between the window 30 and he second electrode 10.

The window 30 is typically made of quartz or sapphire. On the other hand, the O-ring 31 is made of rubber or Teflon and serves to prevent the window 30 from being cracked or damaged in addition to serving as a seal.

A bracket 20 fixed to the second electrode 10 keeps the window 30 in place over the through-hole 11 as pressed against the O-ring 31. The bracket 20 has a hole therethrough aligned with the window 30; the hole 21 has a smaller diameter than the window 30 but one that is still sufficient to allow the inside of the chamber 1 to be viewed through the hole 21 and transparent window 30. According to the present invention, a heat loss-preventing means is provided in the hole 21 of the bracket 20 to thermally isolate the inside of the chamber from the outside, thereby preventing heat loss in the chamber 3 through the transparent window 30.

More specifically, in the embodiment of FIG. 3, a capping member 40 caps the hole 21 in the bracket 20. One side of the capping member 40 is hinged to a corresponding side of the bracket 20. The other side of the capping member 40 is detachably connected to the other side of the bracket 20 by a locking member 41 such as a machine screw.

The heat loss-preventing means comprises a heat-insulating member 50 held within the hole 21 of the bracket 20 as interposed between the transparent window 30 and the capping member 40. The heat-insulating member 50 contacts the transparent window 30 at the front surface of the window. The heat-insulating member 50 is preferably made of a thermally insulative material having low thermal conductivity such as a silicon-based material, or a material made of glass fibers, asbestos, or rubber-based fibers. The heat-insulating member 50 also preferably has a thickness greater than 0.1 mm.

Figure 4A:
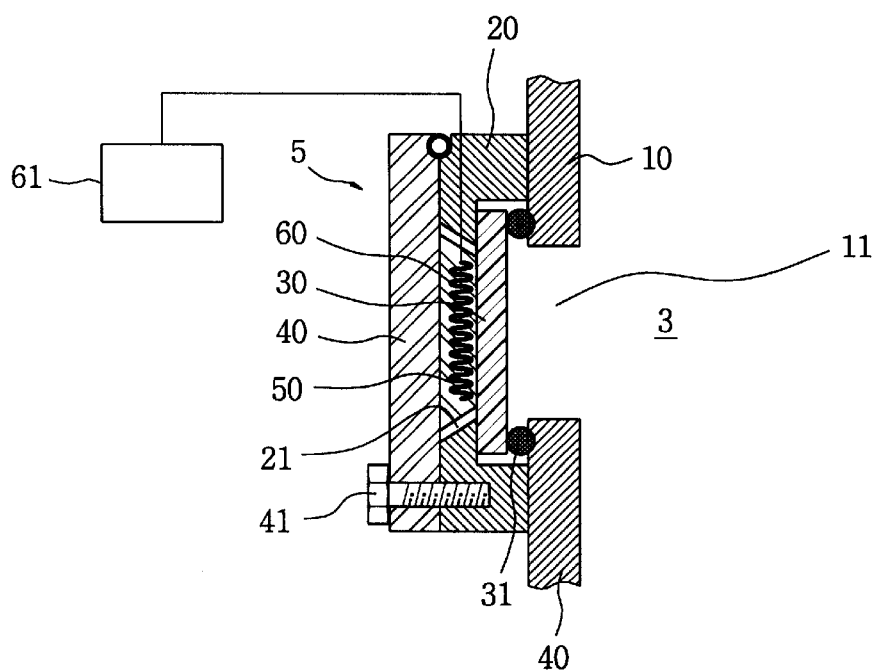
FIGS. 4A and 4B are each an enlarged sectional view of a view port of another embodiment of a chemical vapor deposition apparatus according to the present invention.
Figure 4B:
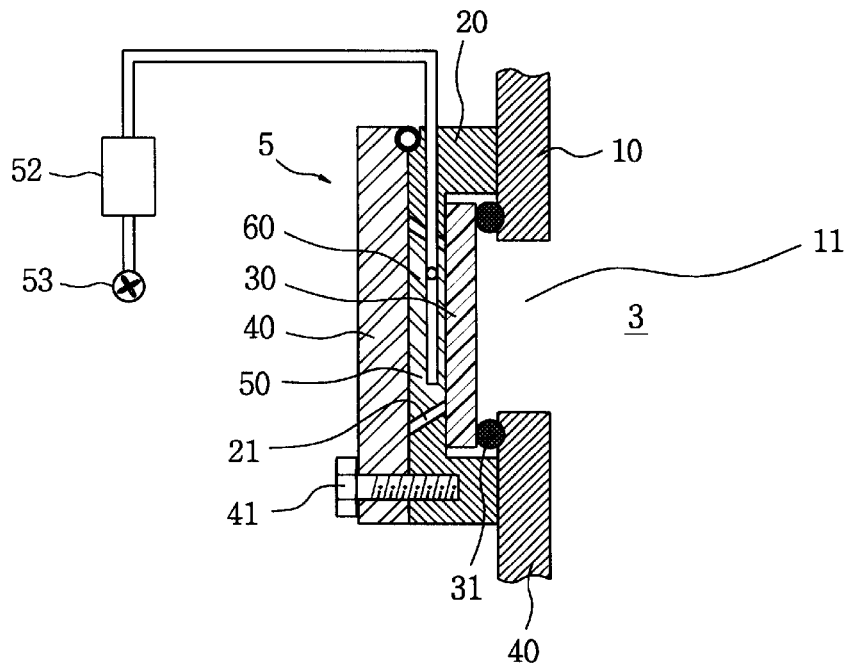

As shown in FIGS. 4A and 4B, the heat-insulating member 50 may comprise a heater element to further limit the amount of heat loss. For instance, as shown in FIG. 4A, a resistive heating element 60 (wire) is embedded in a body of the heat-insulating member 50. The amount of current supplied to the heating element 60 may be controlled by an external controller 61 so that the amount of heat emitted by the heating element is adjustable. Alternatively, as shown in FIG. 4B, the body of the heat-insulating member 50 may have a heating element comprising an air passageway therein, such as a hose, connected to an external source of warm air (e.g. blower 52 and heater 53) such that warm air can be provided within the the heat-insulating member 50.

As another alternative, the heat-loss preventing means may consist of a heating element provided in the opening. For instance, the heating element 60 may be provided in the transparent window 30 without the heat-insulating member 50.

Figure 5:
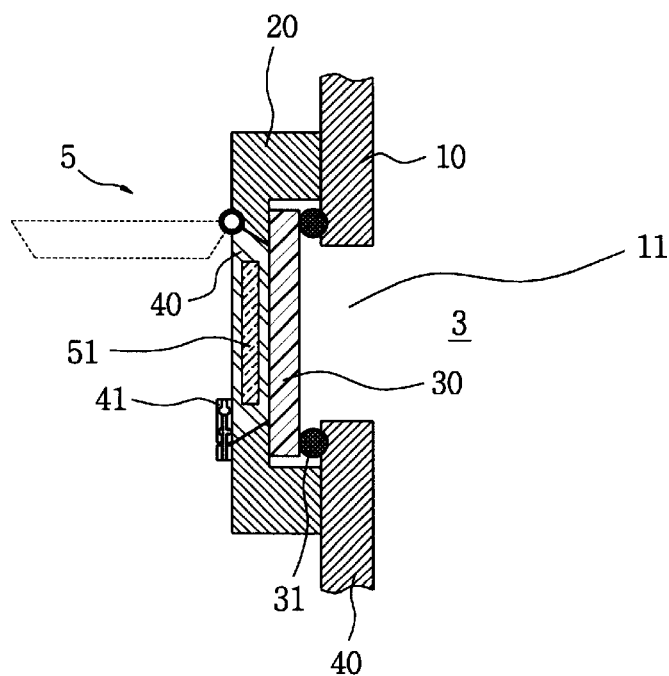
FIG. 5 is an enlarged sectional view of a view port of still another embodiment of a chemical vapor deposition apparatus according to the present invention.

FIG. 5 illustrates another embodiment of the present invention. In this embodiment as well, a second electrode 10 forming a wall of the chamber 3 has through-hole 11. A bracket 20 extends around the through-hole 11, and a transparent window 30 is sandwiched between the bracket 20 and an O-ring 31 at the front of the through-hole 11.

However, in this embodiment, the capping member 40 itself has a shape and size complementary to those of the opening 21 in the bracket 20. Thus, the capping member 40 is disposed in the opening of the bracket 20 instead of over the opening. The capping member 40 comprises a main body, and a heat-insulating member in the form of thermally insulative material 51 embedded in the main body. One side of the capping member 40 is hinged to one side of the bracket 20, whereas the other side of the capping member 40 is detachably connected to the other side with the other side of the bracket 20 by a locking member 40 such as a common latch.

In this embodiment, a heating element controlled by a separate controller can be embedded in the transparent window 30 to limit the amount of heat loss in addition to the heat-insulating material 51.

Figure 6A:
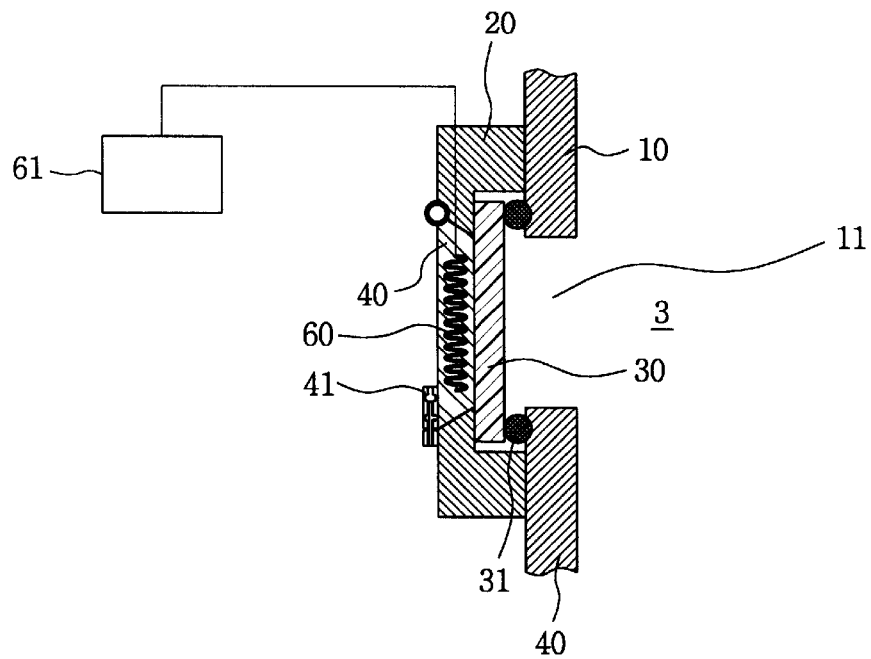
FIGS. 6A and 6B are each an enlarged sectional view of a view port of yet another embodiment of a chemical vapor deposition apparatus according to the present invention.
Figure 6B:
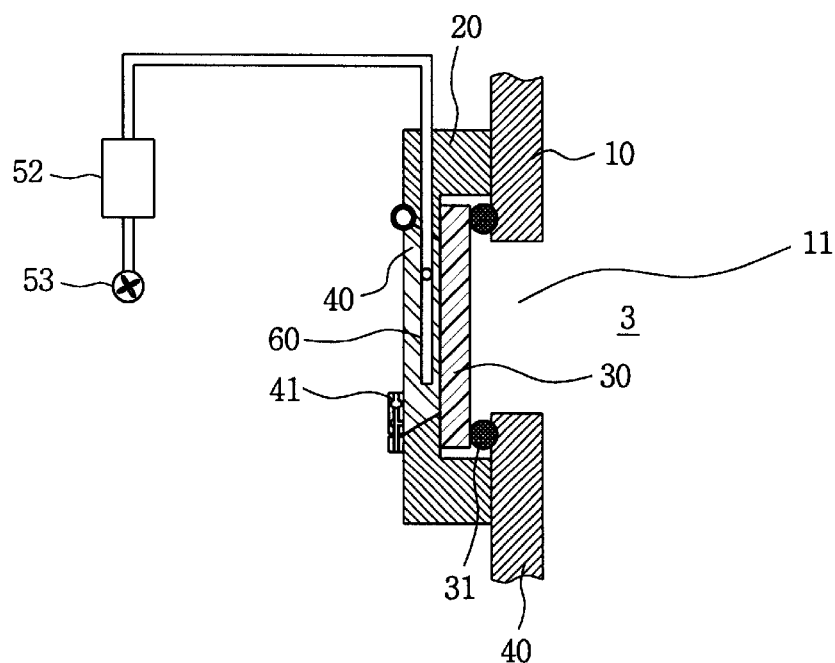

FIGS. 6A and 6B illustrate still another embodiment of the present invention. In this embodiment, the heat-loss preventing means comprises a heating element 60 provided in the body of the capping member 40. The amount of heat supplied by the heating element may be controlled by an external controller. In the version shown in FIG. 6A, the heating element is a resistive heating wire. The resistive heating wire is connected to an external controller 61 so that the amount of heat produced thereby can be adjusted. In the version shown in FIG. 6B, the heating element 60 is a warm air passageway. The passageway is connected to an external heater 52 and blower 53 so that warm air can be introduced into the cap 40.

The operation of the present invention will now be described in more detail.

The chamber 3 is filled with gas and the first electrode, on which a stack of wafers is supported, is supplied with a high frequency power. The gas is transformed into a plasma, the molecules of which are deposited on the wafers. The inside of the chamber 3 is maintained at a very high temperature during the plasma deposition process. At this time, a massive amount of impurities, i.e., "polymer" particles, are generated in the chamber and the polymer is deposited on the inner surface of the transparent window 30 as well as on the inner surfaces of the first and second electrodes.

However, the transparent window 30 of the view port 5 is covered by the heat loss-preventing means, and the capping member 40 completely covers the hole 21 in the bracket 20. Although the inside of the chamber 3 cannot be seen from the outside, the thermal energy in the chamber 3 transmitted through the transparent window 30 is prevented from radiating to the ambient outside of the chamber. Therefore, the transparent window 30 is maintained at a high temperature state and thus, the polymer will not adhere well to the transparent window 30.

That is, even though particles of polymer produced in the chamber 30 float onto the window 30, the window 30 is maintained at a high temperature so that the particles will not adhere thereto. Accordingly, most of the particles will be removed from the window 30 and discharged from the chamber 3 through the vacuum port during the course of removing excess process gas from the chamber 3.

If an operator needs any information regarding the state inside the chamber 3, the capping member 40 can be unlocked and the capping member 40 can be moved from the closed position to an open position as facilitated by the hinge. When the capping member 40 is moved to the open position (phantom lines in FIGS. 3 and 5, for example), the heat loss-preventing means is moved off of the transparent window 30, whereby the inside of the chamber 3 can be seen through the hole 21 and transparent window 30.

According to the present invention, the thermal energy produced during the PECVD process and transmitted through the window of the view port is kept from radiating beyond the window by a heat-insulating member disposed close to the front surface of the window. Similarly, as an alternative or supplement to the heat-insulating member, a heating element is provided close to the front surface of the window to prevent a significant temperature difference from being created between the front and rear surfaces of the window 30.

Accordingly, heat loss at the window is prevented, the window is maintained at a high temperature, and particles of polymer are prevented from adhering to the rear surface of the window inside the process chamber. Moreover, the window can be prevented from being stained, the inside of the chamber can be easily inspected through the window by opening the cap, and the number of cleaning operations required can be minimized.

Although the present invention has been described above in connection with certain preferred embodiments thereof, various modifications of and changes to the preferred embodiments will become apparent to those of ordinary skill in the art. Therefore, all such modifications and changes are seen to be within the true spirit and scope of the invention as defined by the appended claims.

What is claimed is:

1. In a chemical vapor deposition apparatus for manufacturing semiconductor devices, the apparatus having a pair of electrodes, one of the electrodes serving as a wall of a processing chamber of the apparatus and having through-hole, a view port comprising:

a bracket protruding from a wall surface of said one of the electrodes at the outside of said chamber and extending around said through-hole, said bracket defining an opening aligned with said through-hole;

a window of transparent material interposed between said opening in the bracket and said through-hole and pressed against said wall by the bracket;

an annular sealing element extending around said through-hole, said annular sealing element interposed and providing a seal between said window and said wall;

a cap mounted to said bracket so as to be movable between a closed position at which the cap completely covers the opening in said bracket, and an open position at which said opening is exposed so that the inside of said chamber can be viewed through said window; and heat loss-preventing means, integral with said cap, for maintaining the temperature of said cap during the deposition process performed by the apparatus, said heat-loss preventing means being positioned by said cap close to a front surface of the window, facing the outside of said chamber, when the cap is in said closed position, and said heat-loss preventing means being positioned away from said window when said cap is in said open position.

2. The view port of a chemical vapor deposition apparatus as claimed in claim 1, wherein said heat loss-preventing means comprises a body of thermally insulative material.

3. The view port of a chemical vapor deposition apparatus as claimed in claim 1, wherein said heat loss-preventing means comprises an element of a heater.

4. The view port of a chemical vapor deposition apparatus as claimed in claim 3, wherein said element is a resistive heating wire.

5. In a chemical vapor deposition apparatus for manufacturing semiconductor devices, the apparatus having a pair of electrodes, one of the electrodes serving as a wall of a processing chamber of the apparatus and having through-hole, a view port comprising:

a bracket protruding from a wall surface of said one of the electrodes at the outside of said chamber and extending around said through-hole, said bracket defining an opening aligned with said through-hole;

a window of transparent material interposed between said opening in the bracket and said through-hole and pressed against said wall by the bracket;

an annular sealing element extending around said through-hole at the outside wall surface of said one of the electrodes, said annular sealing element interposed and providing a seal between said window and said wall;

a cap extending over said opening in the bracket, said cap being mounted to said bracket so as to be movable between a closed position at which the cap completely covers the opening in said bracket and an open position at which said opening is exposed so that the inside of said chamber can be viewed through said window; and a body of thermally insulative material discrete from and attached to said cap, said body sized to fit in said opening of the bracket, and said body of thermally insulative material being positioned in said opening against a front surface of said window, facing the outside of said chamber, when said cap is in said closed position so as to prevent heat loss through said window, and being positioned away from said window by the cap when said cap is in said open position.

6. The view port of a chemical vapor deposition apparatus as claimed in claim 5, and further comprising an element of a heater disposed within said body of thermally insulative material.

7. The view port of a chemical vapor deposition apparatus as claimed in claim 6, wherein said element is a resistive heating wire.

8. The view port of a chemical vapor deposition apparatus as claimed in claim 6, wherein said element is a warm air passageway extending within said body of thermally insulative material.

9. In a chemical vapor deposition apparatus for manufacturing semiconductor devices, the apparatus having a pair of electrodes, one of the electrodes serving as a wall of a processing chamber of the apparatus and having through-hole, a view port comprising:

a bracket protruding from a wall surface of said one of the electrodes at the outside of said chamber and extending around said through-hole, said bracket defining an opening aligned with said through-hole;

a window of transparent material interposed between said opening in the bracket and said through-hole and pressed against said wall by the bracket;

an annular sealing element extending around said through-hole at the outside wall surface of said one of the electrodes, said annular sealing element interposed and providing a seal between said window and said wall;

a cap having a shape and size complementary to those of said opening in the bracket, said cap being mounted to said bracket so as to be movable between a closed position at which the cap completely occupies the opening in said bracket and contacts a front surface of said window that faces the outside of said chamber, and an open position at which said opening is exposed so that the inside of said chamber can be viewed through said window, and said cap comprising thermally insulative material such that said thermally insulative material is positioned adjacent said front surface of the window when said cap is in said closed position so as to prevent heat loss through said window.

10. In a chemical vapor deposition apparatus for manufacturing semiconductor devices, the apparatus having a pair of electrodes, one of the electrodes serving as a wall of a processing chamber of the apparatus and having through-hole, a view port comprising:

a bracket protruding from a wall surface of said one of the electrodes at the outside of said chamber and extending around said through-hole, said bracket defining an opening aligned with said through-hole;

a window of transparent material interposed between said opening in the bracket and said through-hole and pressed against said wall by the bracket;

an annular sealing element extending around said through-hole at the outside wall surface of said one of the electrodes, said annular sealing element interposed and providing a seal between said window and said wall;

a cap having a shape and size complementary to those of said opening in the bracket, said cap being mounted to said bracket so as to be movable between a closed position at which the cap completely occupies the opening in said bracket and contacts a front surface of said window that faces the outside of said chamber, and an open position at which said opening is exposed so that the inside of said chamber can be viewed through said window, and said cap comprising an element of a heater such that said element of the heater is positioned adjacent said front surface of the window when said cap is in said closed position so as to prevent heat loss through said window.

11. The view port of a chemical vapor deposition apparatus as claimed in claim 10, wherein said element is a resistive heating wire.

12. The view port of a chemical vapor deposition apparatus as claimed in claim 10, wherein said element is a warm air passageway extending within said cap.

* * * * *